(12) United States Patent
Nakamura (10) Patent No.: US 10,141,489 B1
(45) Date of Patent: Nov. 27, 2018

(54) LED ILLUMINATION APPARATUS

(71) Applicant: Shoichi Nakamura, Nagano-ken (JP)

(72) Inventor: Shoichi Nakamura, Nagano-ken (JP)

(73) Assignees: Shoichi Nakamura,
Higashichikuma-Gun, Nagano-Ken (JP);
ACP JAPAN CO., LTD., Tokyo (JP)

(*) Notice: Subject to any disclaimer, the term of this patent is extended or adjusted under 35 U.S.C. 154(b) by 0 days.

(21) Appl. No.: 15/685,621

(22) Filed: Aug. 24, 2017

(51) Int. Cl.
*H01L 33/00* (2010.01)
*H01L 33/58* (2010.01)
*H01L 33/64* (2010.01)
*H01L 33/62* (2010.01)

(52) U.S. Cl.
CPC .............. *H01L 33/58* (2013.01); *H01L 33/62* (2013.01); *H01L 33/642* (2013.01)

(58) Field of Classification Search
CPC ................................ H01L 33/58; H01L 33/62
USPC .......................................................... 257/99
See application file for complete search history.

(56) References Cited

U.S. PATENT DOCUMENTS

2010/0264826 A1* 10/2010 Yatsuda ................... F21K 9/00
315/112
2012/0287651 A1* 11/2012 Hirata ..................... F21V 29/02
362/373
2017/0284648 A1* 10/2017 Nakamura ............ F21V 29/673

FOREIGN PATENT DOCUMENTS

JP        2007-42755 A      2/2007
JP        2011-165351 A     8/2011

* cited by examiner

*Primary Examiner* — Jami V Miller
(74) *Attorney, Agent, or Firm* — Manabu Kanesaka (57) ABSTRACT

A lens casing in an LED illumination apparatus hermetically housing LED elements is cooled. The LED illumination apparatus includes a tubular lens casing, an LED holding part mounting the LED elements thereon, and a base part to which the lens casing is coupled. The base part has a concave part for housing the LED holding part, and the lens casing is coupled to the base part, thereby hermetically sealing the internal space of the lens casing. The base part has support columns protruding into a space outside the LED illumination apparatus and supporting a fan device. The fan device makes taken-in air collide with the base part and exhausts the air through the window parts each formed by adjacent support columns and the side of the frame of the fan device and the side of the base part that face each other as upper and lower frames thereof.

11 Claims, 12 Drawing Sheets

LED ILLUMINATION APPARATUS

BACKGROUND OF THE INVENTION

Field of the Invention

The present invention relates to a small-sized wearable LED illumination apparatus that a person wears for illuminating an object.

Description of the Related Art

Various illumination apparatuses using high-efficient and long-life LED elements have been put into practical use. However, the illumination apparatus using such an LED device has a problem that light emitting efficiency of an LED is degraded when the temperature inside a main body casing of the illumination apparatus becomes high due to heat generated from the LED elements, resulting in a decrease in optical output or shortening of the life time of the LED element.

Thus, in conventional LED illumination apparatuses, a plurality of fins are provided on the back side of a substrate mounting the LED elements thereon in order to cool the LED element (see, for example, Patent Document 1). Further, there is known an LED illumination apparatus that actively performs cooling using a fan device (see, for example, Patent Document 2).

PRIOR ART DOCUMENT

Patent Document

[Patent Document 1] Japanese Patent Application Publication No. 2007-42755
[Patent Document 2] Japanese Patent Application Publication No. 2011-165351

Among the various illumination apparatuses using the LED element, there is known a small-sized LED illumination apparatus which is fitted to a wearing article such as glasses or a headband or clothes worn by a person in use. When such an illumination apparatus is fitted to the head of a person, a direction in which his or her face is turned and light irradiation direction coincide with each other. This means that the illumination apparatus can perform illumination along the line of sight of a person. Thus, an illumination apparatus of such a type is used as an apparatus optimum for use in lighting the hands of a working person in a spotlight manner.

However, this type of illumination apparatus has a small size and a light weight so as not to be a burden on the person wearing the apparatus, and the volume capacity of a lens casing that houses the LED elements therein is reduced. Accordingly, the surface area of an illumination part in the lens casing is reduced, so that when dirt or water droplets adhere inside the case due to entering of dust or moisture to cloud an illumination surface, illuminance significantly decreases.

Thus, the small-sized LED illumination apparatus hermetically houses the LED elements inside the lens casing in order to prevent entering of dirt or moisture; however, when the lens casing having a small volume capacity is hermetically sealed, the temperature inside the casing may rise in a short time, which is unsuitable for a long-term use. In addition, in most cases, a lens for emitting LED light is made of resin for ensuring light weight, and such a lens may be damaged by heat.

Further, in a hermetically sealed space, even when fins are provided on the back surface of a substrate mounting the LED elements thereon for the purpose of preventing the temperature of the interior of the lens casing from rising, it is difficult to achieve heat exchange, and even when a fan device is provided, it is difficult to perform forced cooling by external air.

SUMMARY OF THE INVENTION

The present invention has been made in view of the above points, and the object thereof is to effectively cooling the inside of a lens casing in an LED illumination apparatus that hermetically houses the LED elements in the lens casing.

To solve the above problems, there is provided an LED illumination apparatus including: a tubular lens casing that has a first end face at which illuminating lenses are provided and a second end face; an LED holding part on which LED elements are mounted; a base part provided on the second end face side of the lens casing; a concave part formed in the base part so as to house the LED holding part; a coupling part that holds a coupling state between the lens casing and the base part by fitting the lens casing to the concave part at the second end face to hermetically seal the internal space of the lens casing; support columns formed so as to protrude from the base part to a space outside the LED illumination apparatus; and a fan device having a frame supported by the support columns, wherein the fan device makes taken-in air collide with the end face of the base part that faces away from the concave part and exhausts the air through the window parts each formed by adjacent support columns as a pair of side frames thereof and the sides of the respective frame and base part that face each other as upper and lower frames thereof.

Further, to solve the above problems, there is provided an LED illumination apparatus including: a tubular lens casing that has a first end face at which illuminating lenses are provided and a second end face; an LED holding part on which LED elements are mounted; a base part provided on the second end face side of the lens casing and having, in the outer surface thereof, a plurality of air passages extending toward the lens casing; a concave part formed in the base part so as to house the LED holding part; a coupling part that holds a coupling state between the lens casing and the base part by fitting the lens casing to the concave part at the second end face to hermetically seal the internal space of the lens casing; a fan device disposed opposite to the base part; and a housing having openings at its both ends and housing therein the base end part and fan device, wherein the base end part is disposed inside the housing with the air passages facing one of the openings, and the fan device is disposed so as to take in air through the air passages and discharge the taken-in air from the other one of the openings.

At this time, the LED holding part is fixed to the bottom surface of the concave part with a screw, and heat generated from the LED elements is transmitted to the base part through the screw. Further, the leading end of the screw penetrates through the bottom surface of the concave part and protrudes from the back surface of the base part, whereby heat exchange can be achieved at the protruding part of the screw.

The surface of the end of the base part that is opposed to the fan device is preferably made irregular. With this configuration, an area with which the air from the fan device collides is increased, so that heat radiation effect from the end face of the base part can be enhanced.

Further, it is preferable that the surface of the end of the base part that is opposed to the end having the concave part is made to protrude toward the fan device and that the side surface of the protruding portion is formed into a step-like shape or a substantially tapered shape. With this configuration, air taken in by the fan device flows along the side surface of the protruding portion to be discharged through the window parts, whereby effective heat exchange can be achieved at the base part.

Further, when a plurality of grooves are formed in the side surface of the base part, the grooves serves as fins, whereby heat is effectively radiated from the side surface. The grooves are formed so as to extend from the fan device toward the lens casing, so that a part of the air going out from the window parts flows along the grooves. Thus, the flow of air on the side surface is accelerated to further enhance heat exchange efficiency by the grooves.

Further, heat radiation coating or heat absorption coating including black alumite treatment is applied on the outer surface of the base part and the inner surface of the concave part, whereby heat from the LED holding part is efficiently absorbed by the base part, and heat radiation efficiency is further enhanced. The black alumite treatment uses treatment liquid containing no environmental load substance.

Further, a cut part is preferably formed in the side surface of the frame that substantially communicates with the support column. With this configuration, the flow of the air not taken in by an impeller but going along the side surface of the frame is accelerated and, at the same time, the flow of the air taken in by the impeller to be discharged from the window parts is accelerated, whereby heat radiation efficiency by the fan device is further enhanced.

According to the present invention, the concave part is formed in the base part that hermetically seals the lens casing, and the LED holding part mounting the LED elements thereon is housed in the concave part, whereby heat generated from the LED elements is efficiently transmitted to the base part. In addition, effective heat radiation from the base part can be achieved by heat exchange with the airflow in which air taken in by the fan device supported by the support columns provided so as to protrude from the back surface of the base part is discharged from the window parts, whereby durability of the LED illumination apparatus is enhanced.

DESCRIPTION OF THE PREFERRED EMBODIMENTS

Hereinafter, embodiments of the present invention will be described with reference to the accompanying drawings.

First Embodiment

Figure 1:
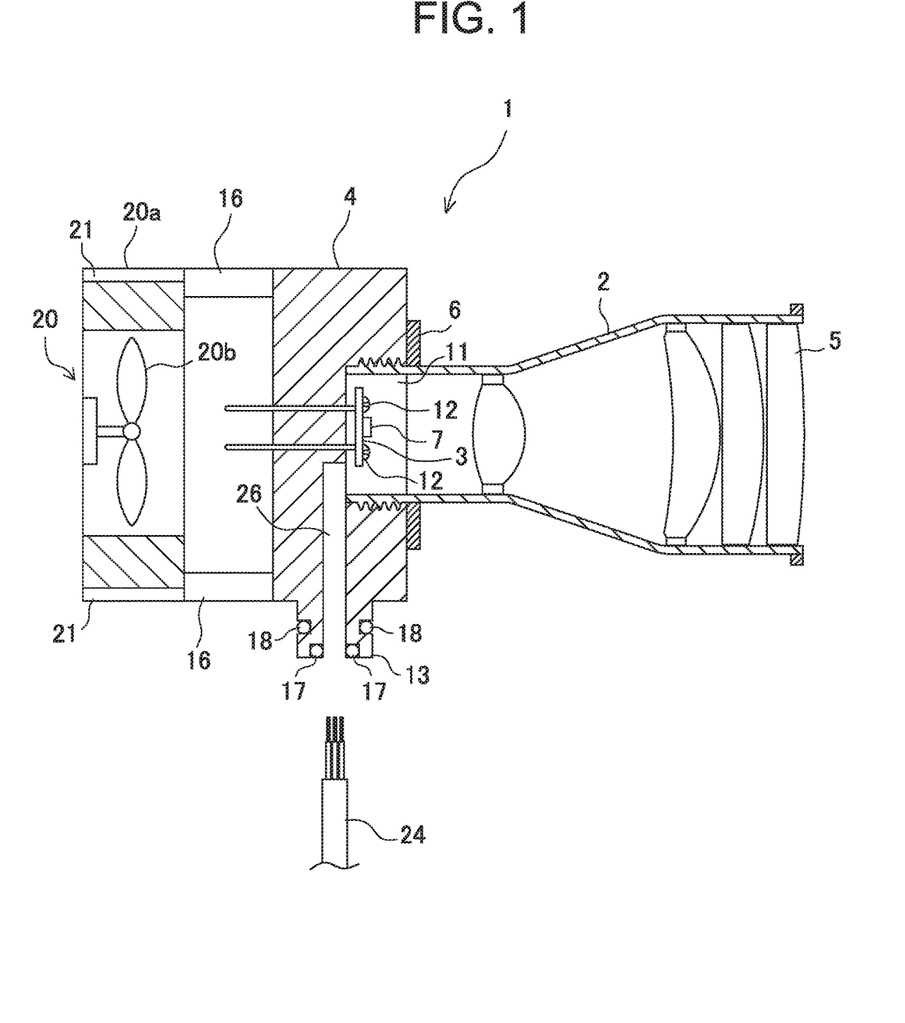
FIG. 1 is a cross-sectional side view of an LED illumination apparatus according to a first embodiment of the present invention.

FIG. 1 is a cross-sectional side view illustrating a wearable type LED illumination apparatus 1 which is to be attached to the body of an operator and irradiates an object with light in the attached state. The LED illumination apparatus 1 is obtained by assembling the components illustrated in FIG. 2.

Figure 2:
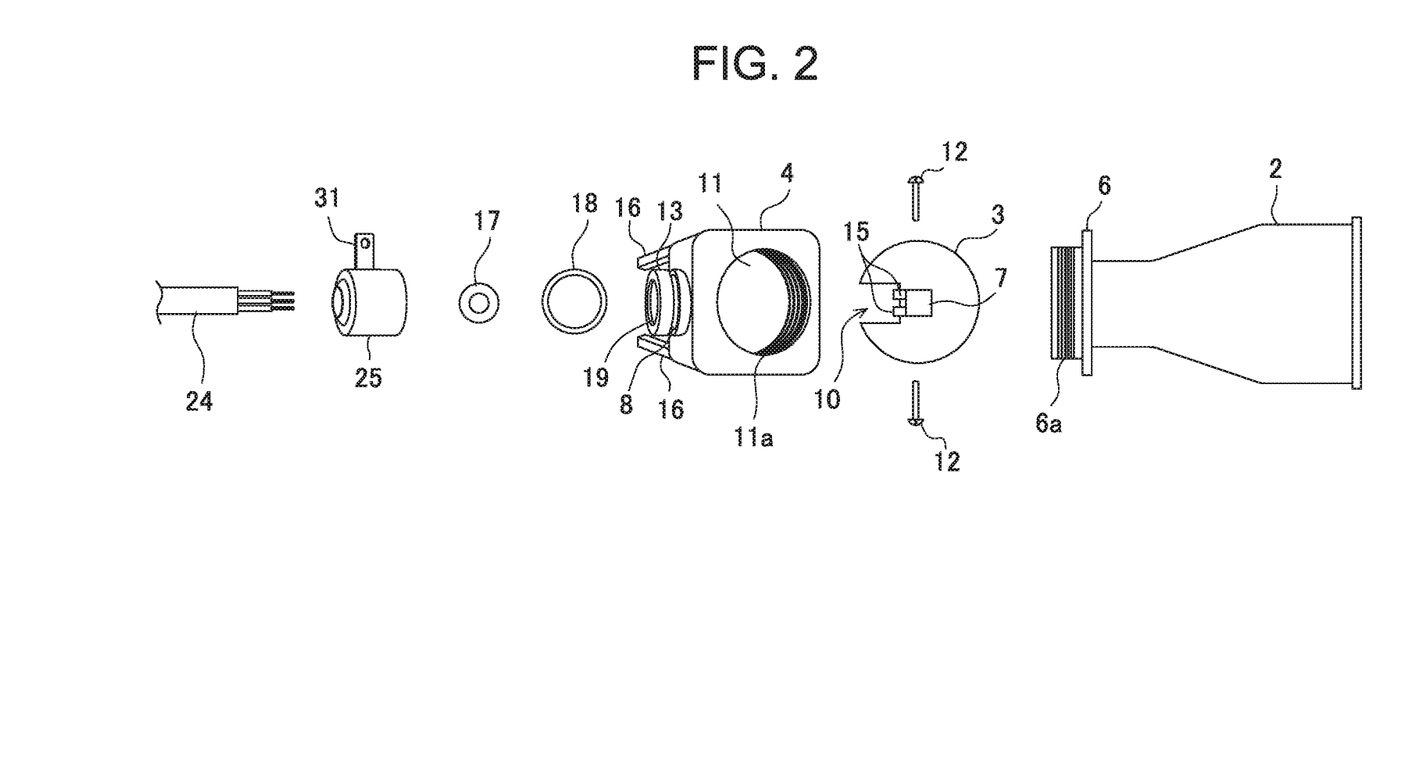
FIG. 2 is an exploded view of the LED illumination apparatus according to the first embodiment, which illustrates individual components constituting the LED illumination apparatus.

A lens casing 2 is a substantially truncated cone-shaped tube and incorporates a lens system 5 composed of a plurality of concaved lenses for irradiating an object with light in a spot. The lens casing 2 has, at its base end portion, a coupling part 6 for connecting to a base part 4, and a helically continued protrusion 6a is formed on the outer peripheral surface of the coupling part 6.

An LED holding part 3 is a circular part on which an LED package 7 including a plurality of LED elements are mounted with an adhesive and is made of resin having high heat conductivity or metal (including an alloy). In this case, the adhesive is preferably a silicone-based adhesive excellent in heat conductivity. The LED holding part 3 has, at a part of the circumference thereof, a substantially square cut part 10, and a lead 15 of the LED package 7 is drawn out into the cut part 10.

The base part 4 having a rectangular parallelepiped shape is formed of a metal material such as aluminum and has a cylindrical concave part 11 for housing the LED holding part 3. By housing the LED holding part 3 in the concave part 11, heat generated from the LED package 7 is efficiently absorbed by the base part 4. In order to further enhance heat radiation efficiency, it is preferable to apply heat radiation coating or heat absorption coating on the outer surface of the base part 4 and the inner surface of the concave part 11. For example, the heat radiation coating is achieved by black alumite treatment using treatment liquid containing no environmental load substance.

The base part 4 has, at the side surface thereof, a receiving port 13 for receiving a harness 24 externally inserted into the base part 4. The harness 24 includes a power feed line to the LED package 7 and a power feed line and a ground line to a fan device 20 to be described later. The harness 24 is introduced into the concave part 11 through a path 26 connecting the receiving port 13 and the concave part 11. Thus, the cut part 10 of the LED holding part 3 is disposed opposite to the exit side of the path 26, and the power feed line and ground line extending from the harness 24 to the LED package 7 are connected to the lead 15 of the LED package 7 by soldering. As a result, in the present example, 7.2 V power is externally supplied to the LED package 7 through the harness 24, whereby the LED chip emits light.

When the harness 24 is assembled to the base part 4, it is made to pass through a grommet 25 and hollow parts of respective O-rings 17 and 18, so as to be inserted into the receiving port 13. Then, the grommet 25 is fitted over the receiving port 13, whereby the O-ring 17 is locked to an annular receiving part 19 formed in the inner peripheral wall of the receiving port 13, and the O-ring 18 is fitted into an annular groove part 8 formed on the outer surface of the receiving port 13. As a result, the receiving port 13 is hermetically sealed with the harness 24 passed therethrough.

The LED holding part 3 is fixed to the bottom surface of the concave part 11 with a pair of screws 12. At this time, the LED holding part 3 may be disposed so as to contact the bottom surface of the concave part 11 or disposed spaced apart therefrom. In the present example, the LED holding part 3 and concave part 11 are fixed to each other with the screw 12 with a gap provided between the LED holding part 3 and the bottom surface of the concave part 11 for facilitating connection between the lines of the harness 24 and the lead 15 of the LED package 7 at assembly. In addition to fixing the LED holding part 3 to the concave part 11 of the base part 4, the screw 12 radiates heat generated at the LED package 7 to the outside. Particularly, when the fixing is made with a gap provided between the LED holding part 3 and the bottom surface of the concave part 11, the screw 12 directly transmits heat of the LED holding part 3 to the base part 4, so that a screw made of copper or tungsten is most suitably used as the screw 12. When the screw 12 is made of copper, silver plating is preferably applied to the surface thereof for corrosion prevention.

An engagement groove 11a engaged with the protrusion 6a of the coupling part 6 is helically formed in the inner peripheral wall of the concave part 11. Thus, by fitting the coupling part 6 of the lens casing 2 into the concave part 11 and rotating the same, the lens casing 2 and base part 4 are fastened to each other to be screw-coupled. Thus, the lens casing 2 is hermetically sealed by the O-rings 17 and 18 with the harness 24 passed through the receiving port 13, so that the inside of the lens casing 2 is kept in a hermetically sealed state, thereby preventing entering of dust or moisture.

Figure 4:
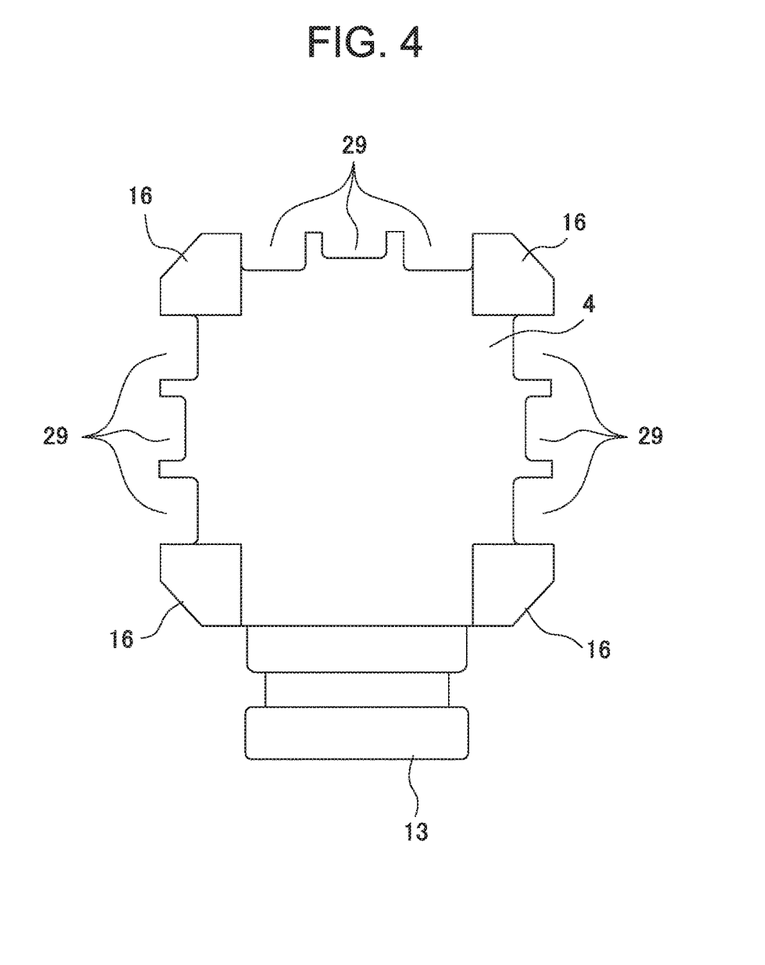
FIG. 4 is a plan view of one end face of a base part of the LED illumination apparatus.

Support columns 16 for supporting the fan device 20 are provided at respective four corners of the end face of the base part 4 on the opposite side at which the concave part 11 is formed. The support columns 16 protrude from the end face of the base part 4 and thus serve as a heat radiation part that radiates heat that the base part 4 receives from the LED holding part 3 to the outside air. The base part 4 itself also serves as a heat radiation part that radiates heat received from the LED holding part 3 to the outside air. The base part 4 has a plurality of grooves 29 each having a U-like cross section in the side surfaces thereof. The grooves 29 each function as a cooling fin, thereby enhancing heat radiation effect of the base part 4.

Figure 3:
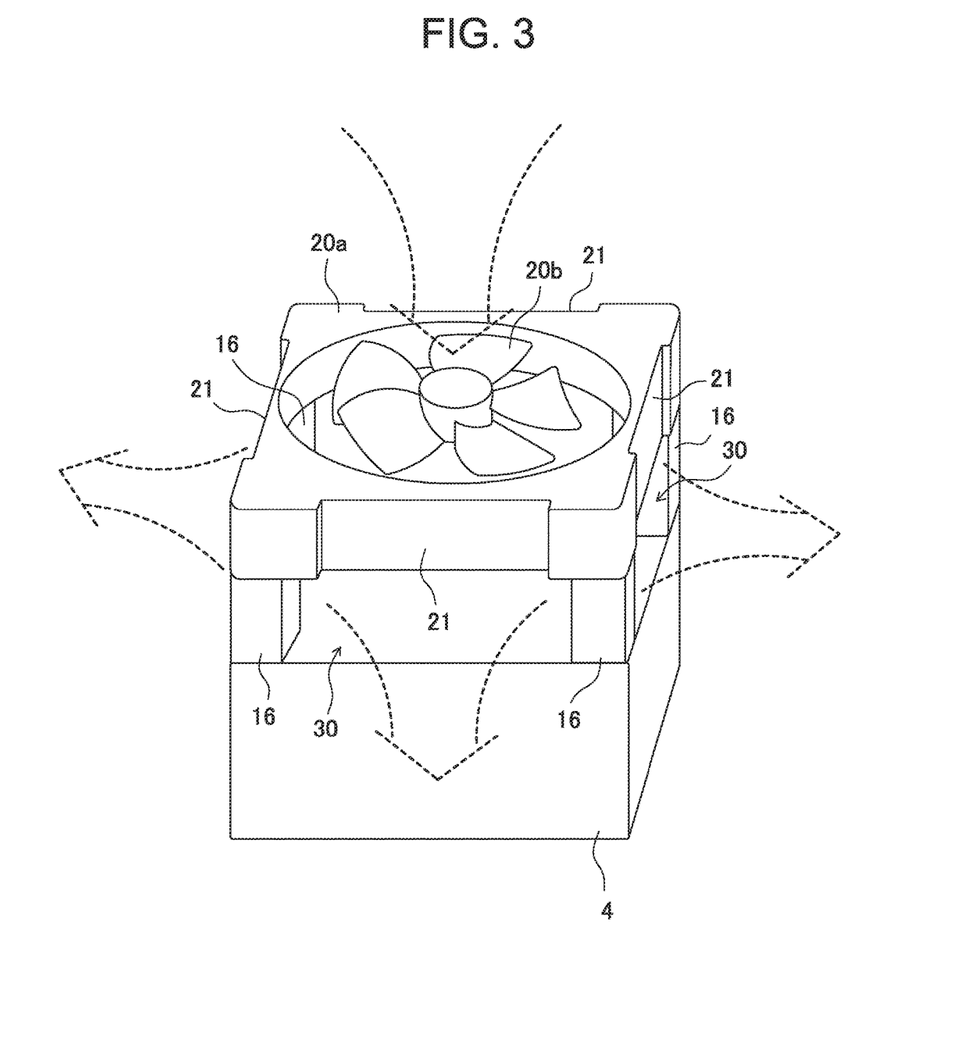
FIG. 3 is a perspective view explaining a fan device of the LED illumination apparatus.

As the fan device 20, a very small-sized fan device provided with a brushless DC fan motor having a small size (over 10 mm square and a thickness of about several mm) and a small capacity (about 3 V to 5 V) is used. The fan device 20 is disposed inside a frame 20a serving as a wind tunnel and is supported at the leading ends of the support columns 16 by the frame 20a. When an impeller 20b is rotated, the fan device 20 takes in air in the frame 20a from outside and blows the air in its axial direction. Then, the blown air collides with the end face of the base part 4 and is exhausted outside in four directions through four window parts 30 each formed by adjacent support columns 16 as a pair of side frames thereof and the sides of the respective frame 20a and base part 4 that face each other as upper and lower frames thereof. Although not illustrated, the power feed line to the fan device 20 and the ground line which are branched from the harness 24 are connected to a DC fan motor, and 3-V power is fed thereto in the present example.

It is preferable to form a cut part 21 in each of four side surfaces of the frame 20a of the fan device 20 so as to extend from the side on the air intake side to the side on the air discharge side. That is, in a state where the fan device 20 is driven to generate an airflow, the cut part 21 formed in the side surfaces of the frame 20a accelerates the flow of the air that is not taken in by the impeller 20b but flows along the side surfaces of the frame 20a, which in turn accelerates the flow of the air that is taken in by the impeller 20b and discharged from the window parts 30.

The heat radiation action of the LED illumination apparatus 1 having the above configuration will be described. Heat generated in the LED package 7 at illumination is efficiently transmitted to the base part 4 since the LED holding part 3 mounting the LED package 7 thereon is housed in the concave part 11 formed in the base part 4. In this case, as described above, the screw 12 directly connecting the base part 4 and the LED holding part 3 effectively contributes to heat transmission.

Then, end faces of the support columns 16 and the base part 4 perform heat exchange with air by the airflow formed by the drive of the fan device 20 and discharged from the window parts 30, whereby heat transmitted from the LED holding part 3 to the base part 4 is radiated. On the other hand, in the base part 4, the grooves 29 each function as a fin, so that heat is effectively radiated from the side surfaces of the base part 4. Further, the flow of the air discharged from the window parts 30 is accelerated by a negative pressure generated by the air that is not taken in by the impeller 20b but flows along the side surfaces of the frame 20a, so that heat exchange efficiency between the support columns 16 and base part 4 and air is enhanced.

Figure 5A:
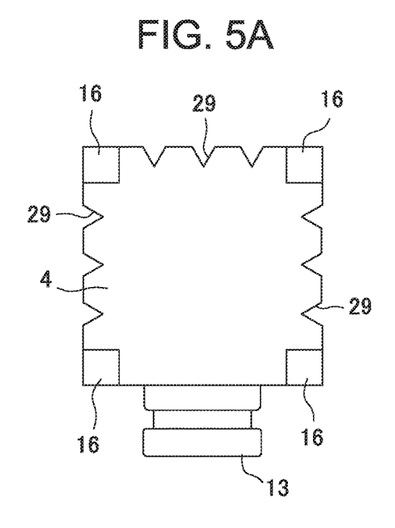
FIGS. 5A to 5D are schematic plan views of the end face of the base part, each of which illustrates the cross-sectional shape of a groove formed in the side surface of the base part.
Figure 5B:
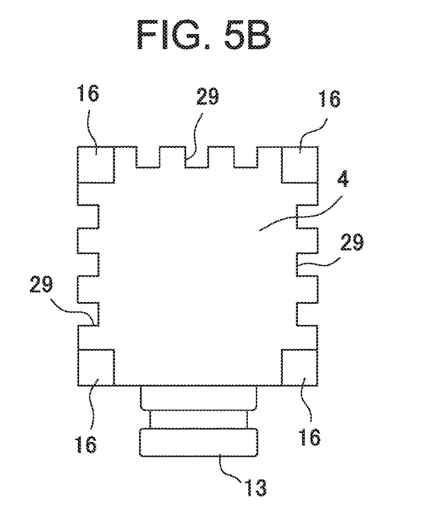
Figure 5C:
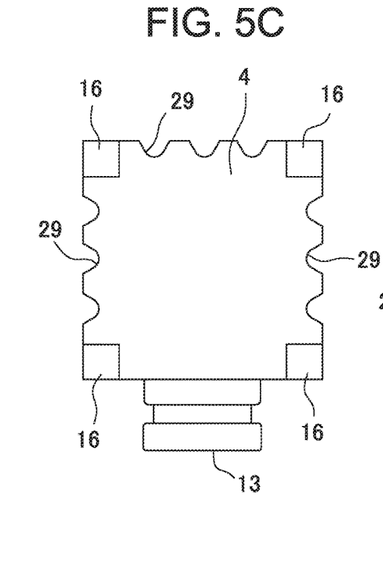
Figure 5D:
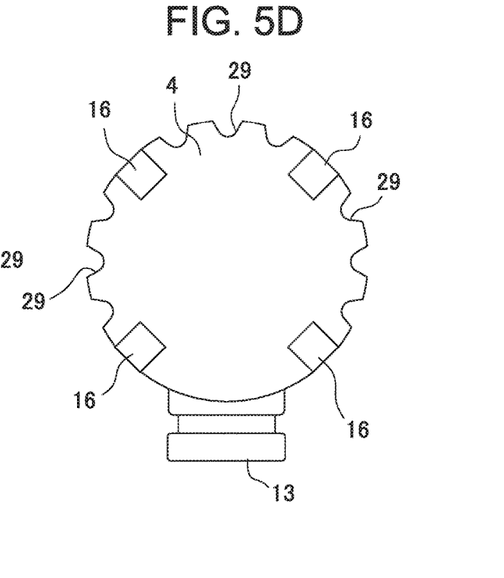

Further, at this time, a part of the air discharged from the window parts 30 flows from the side surfaces of the base part 4 toward the lens casing 2, and since the grooves 29 are formed so as to extend in this direction, the airflow on the side surfaces is accelerated, thereby enhancing heat exchange efficiency from the side surfaces of the base part 4. As illustrated in FIGS. 5A, 5B, and 5C, the cross-sectional shape of each groove 29 may be a triangular shape, a square shape, or a semicircular shape. Further, as illustrated in FIG. 5D, the shape of the base part 4 may be a columnar shape having a circular cross-sectional shape and, in this case, semicircular grooves 29 are formed in the side surface.

Figure 6A:
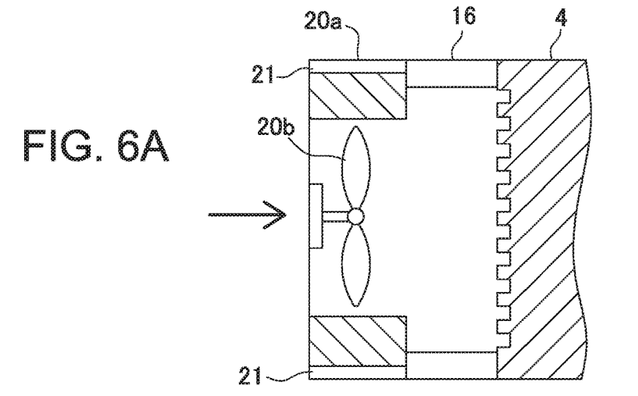
FIGS. 6A to 6C are cross-sectional side views each illustrating a modification for effective heat radiation from the fan device side end face of the base part.
Figure 6B:
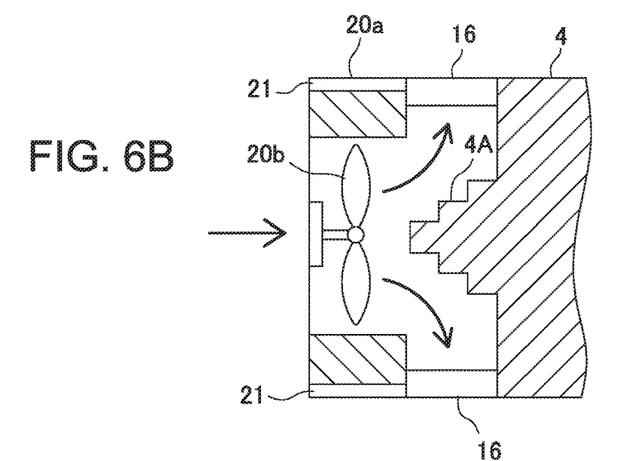
Figure 6C:
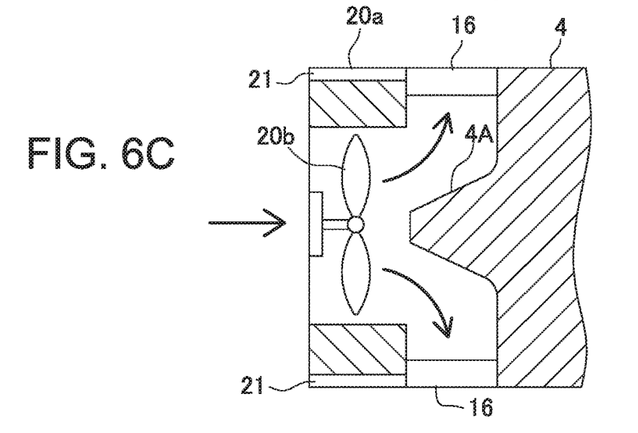

In order to enhance heat exchange efficiency at the end face of the base part 4, the end face is preferably made irregular, as illustrated in FIG. 6A. Further, it is preferable to form a protruding part 4A protruding from the end face toward the fan device 20. In this case, the protruding part 4A is formed such that the shape of side surface thereof is a step-like shape as illustrated in FIG. 6B or a substantially tapered shape as illustrated in FIG. 6C. Thus, the air taken in by the fan device 20 flows while being subjected to heat exchange along the side surface and is discharged from the window parts 30.

Figure 7:
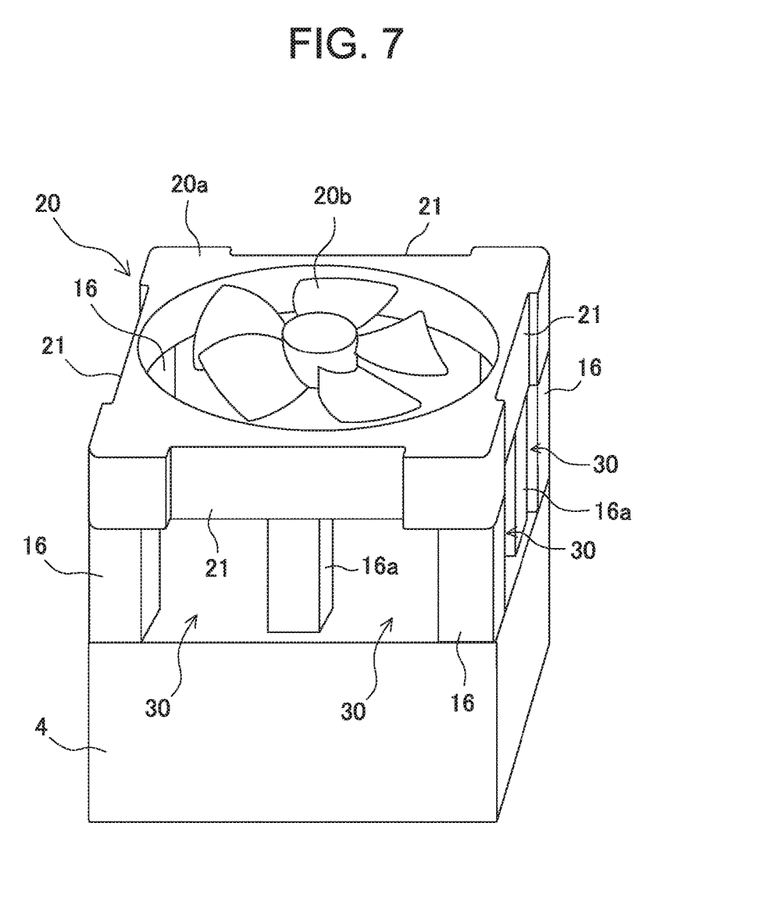
FIG. 7 is a perspective view explaining another example of a window part.
Figure 8:
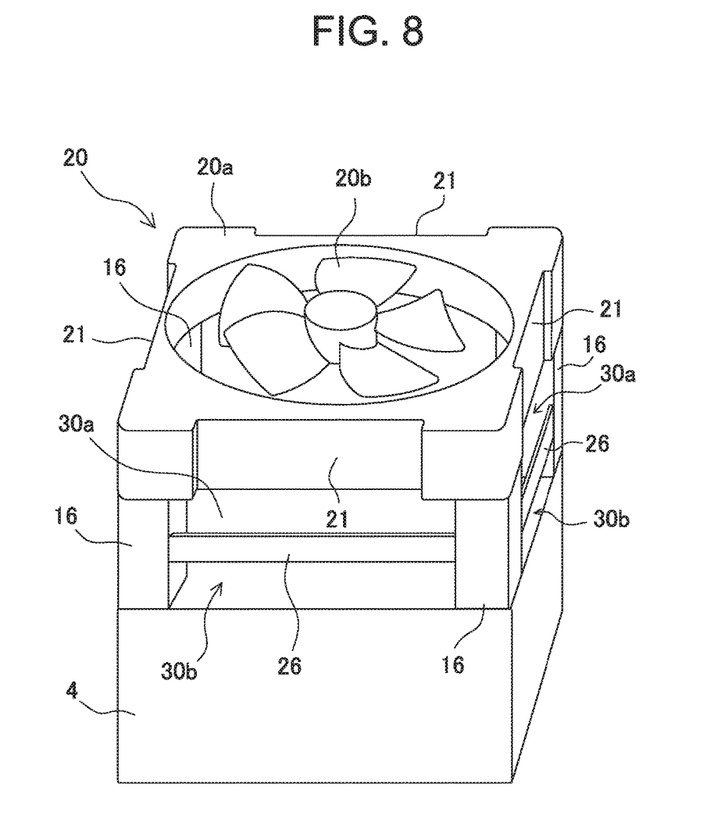
FIG. 8 is a perspective view explaining still another example of the window part.

As illustrated in FIG. 7, when a support column 16a is disposed at the center of the side of the end face, in addition to the support columns 16 at the respective four corners of the end face of the base part 4, to increase the number of the window parts 30, a variety of airflows are formed to thereby enhance heat radiation efficiency. Alternatively, as illustrated in FIG. 8, a bar 26 is stretched between the center portions of the respective adjacent support columns 16 along the side of the end face of the base part 4 to form a two-tiered window part (window part 30a and window part 30b) along the flow of the air from the fan device 20. In this configuration as well, cooling efficiency is enhanced.

Figure 9:
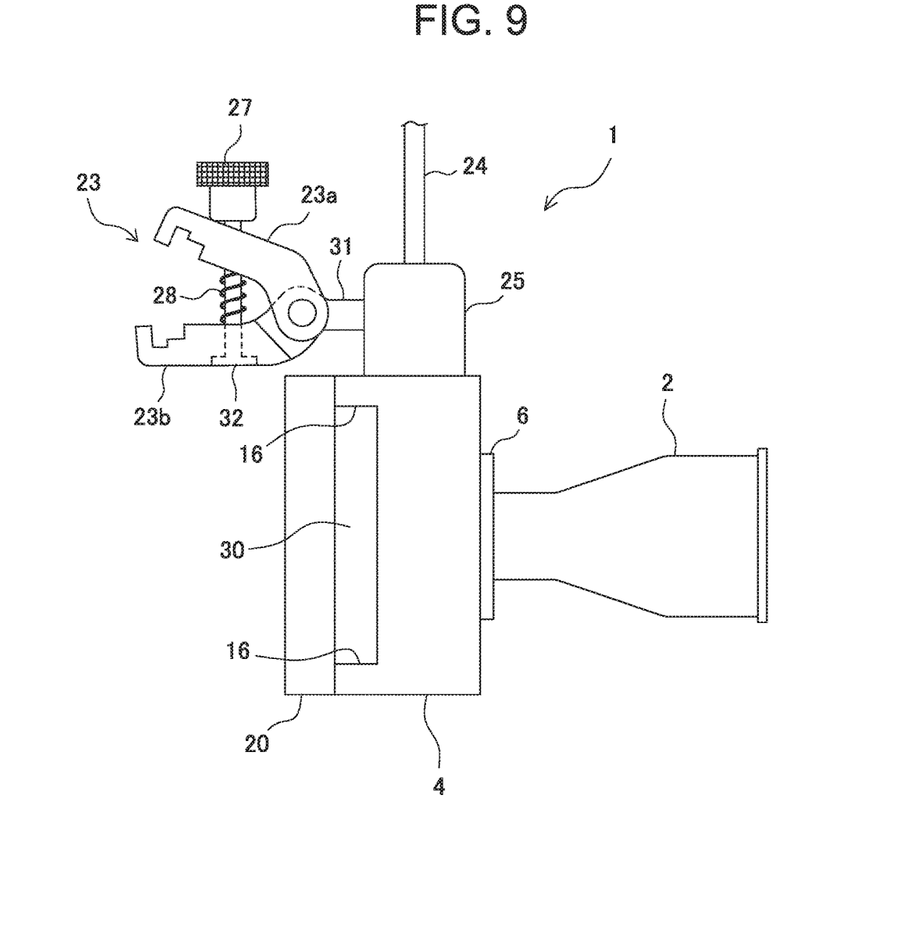
FIG. 9 is a side view of the LED illumination apparatus to which a holding part is mounted.

As illustrated in FIG. 9, the LED illumination apparatus 1 has an arm 31 fixedly mounted to the harness 24. The arm 31 is turnably coupled to a holding part 23 used for fitting the LED illumination apparatus 1 to a wearing article such as glasses or a headband or clothes worn by an operator. The holding part 23 includes a pair of holding pieces 23a and 23b whose one end portions are turnably coaxially supported by the arm 31, a screw 27, a spring 28, and a nut 32. The screw 27 is fixedly mounted to the holding piece 23b, and the leading end of the screw shaft penetrates through the holding piece 23a to be fitted with the nut 32. The spring 28 is fitted around a part of the screw shaft between the holding pieces 23a and 23b.

The LED illumination apparatus 1 provided with the above arm 31 can be worn by a person by being fitted to, e.g., a glasses flame. In this case, a bridge part of the glasses frame that connects the left and right glasses is held between the holding pieces 23a and 23b, and the nut 32 is rotated in the fastening direction. As a result, the holding part 23 securely holds the bridge part, and the LED illumination apparatus 1 is held by the glasses frame. When the nut 32 is loosened in this state, the holding pieces 23a and 23b are separated from each other, with the result that the holding part 23 releases the holding state of an attachment part 38. The LED illumination apparatus 1 can be fitted not only to the glasses frame, but also to a headband or a hat worn by a person by means of the holding part 23.

Second Embodiment

Figure 10:
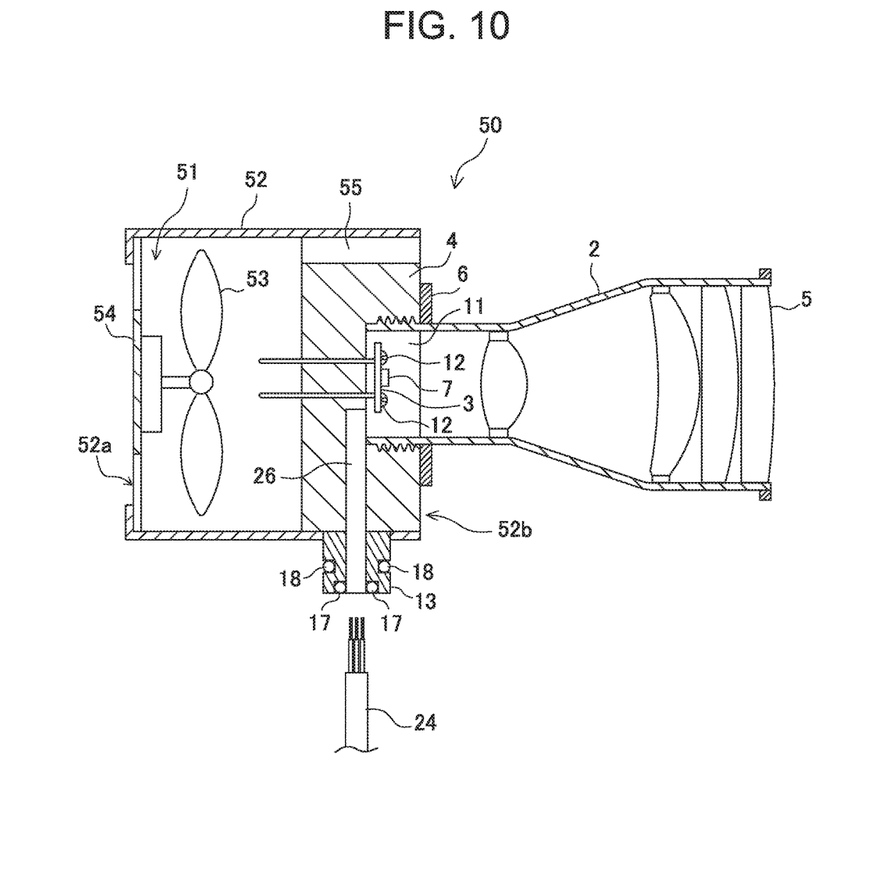
FIG. 10 is a cross-sectional side view of an LED illumination apparatus according to a second embodiment of the present invention.

FIG. 10 is a cross sectional side view illustrating an LED illumination apparatus 50 according to a second embodiment. In the second embodiment, the same reference numerals are given to the same components as those in the first embodiment and a detailed description thereof will be omitted.

The LED illumination apparatus 50 includes the tubular lens casing 2 incorporating the lens system 5 therein, LED holding part 3, base part 4, concave part 7 formed in the base part 4, coupling part 6, a fan device 51, a housing 52 housing the base part 4 and fan device 51, and the like. In the present embodiment, the LED illumination apparatus 50 does not have the support columns 16, which function as the heat radiation part (heat sink) in the first embodiment.

Figure 11:
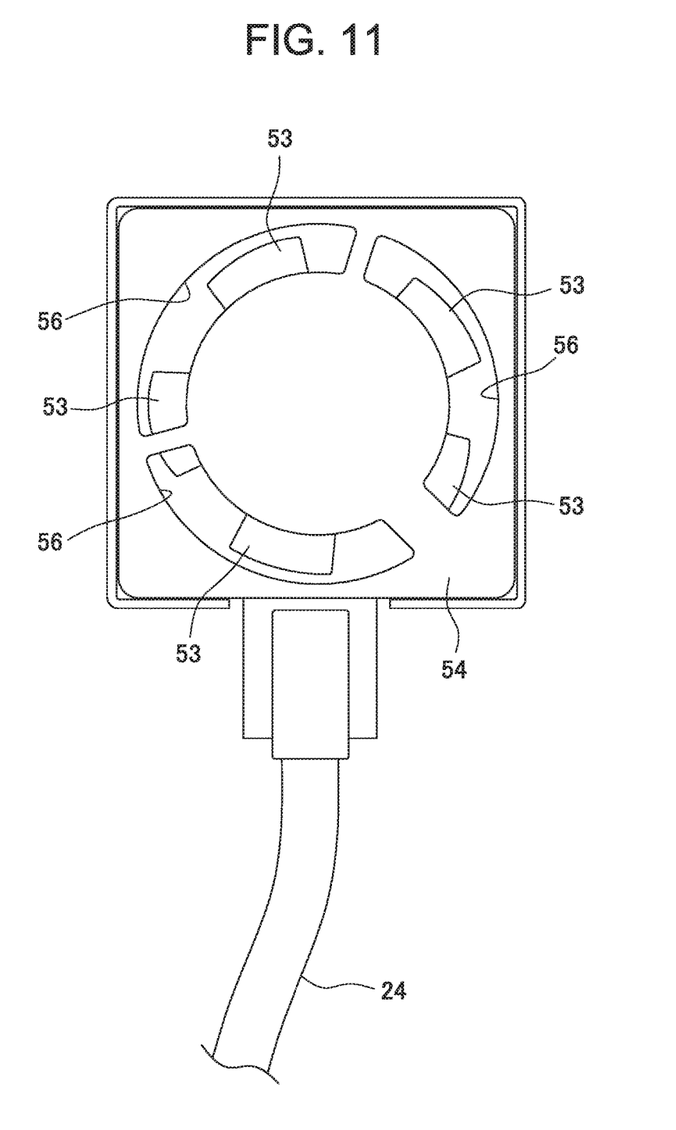
FIG. 11 is a plan view of the LED illumination apparatus of FIG. 10 as viewed from the left.

The fan device 51 is an axial flow type fan like the fan device 20 of the first embodiment. The housing 52 has openings 52a and 52b at its both ends. A mounting plate 54 for a small-sized DC fan motor in which an impeller 53 is mounted to the rotary shaft thereof is fitted in and fixed to the opening 52a with the peripheral end thereof contacting the inner wall of the housing 52, as illustrated in FIG. 11. A plurality of exhaust ports 56 are formed in the mounting plate 54 at regular intervals along the peripheral direction in which the impeller 53 is rotated.

Figure 12:
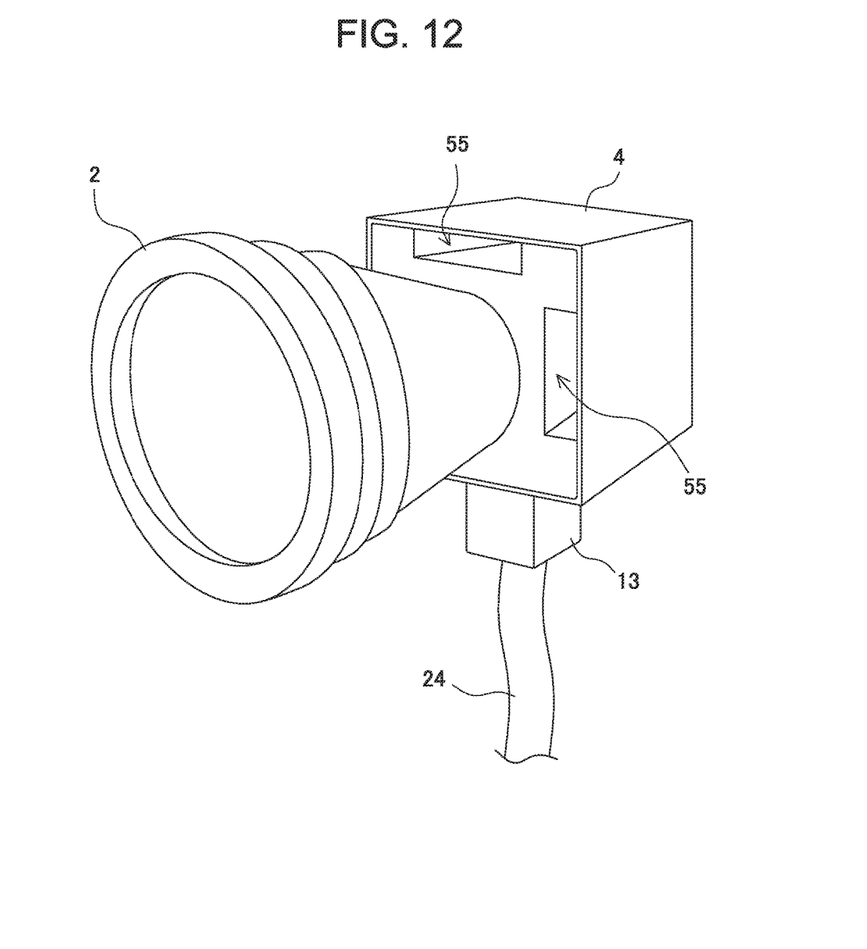
FIG. 12 is a perspective view of the LED illumination apparatus of FIG. 10 as viewed from the right.

Of the four side surfaces of the base part 4 having the rectangular parallelepiped shape, the three side surfaces other than the surface on which the receiving port 13 for receiving the harness 24 incorporated into the base part 4 is formed each have a groove serving as an air passage 55 extending toward the lens casing 2. The base part 4 is fitted in and fixed to the opening 52b such that the air passages 55 are parallel to the axial direction of the housing 52.

When the fan device 51 is driven, air taken in from the opening 52b is absorbed by the fan device 51 after passing through the air passage 55 and is then discharged from the exhaust port 56. As a result, the base part 4 is effectively cooled by heat exchange with the airflow passing through the side surfaces, whereby the function of the base part 4 as a heat sink is enhanced.

In the second embodiment, as in the first embodiment, by making the end face of the base part 4 that is opposed to the fan device 51 irregular, or by making the same protrude toward the fan device 51 and forming the side surface of the protruding portion into a step-like shape or a substantially tapered shape, cooling efficiency can be further enhanced.

The present invention is not limited to the above embodiments but may be variously modified within the spirit of the invention, and the modified configurations are not excluded from the present invention.

What is claimed is:
1. An LED illumination apparatus comprising:
a tubular lens casing that has a first end face at which illuminating lenses are provided and a second end face;
an LED holding part on which LED elements are mounted;
a base part provided on the second end face side of the lens casing;
a concave part formed in the base part so as to house the LED holding part;
a coupling part that holds a coupling state between the lens casing and the base part by fitting the lens casing to the concave part at the second end face to hermetically seal the internal space of the lens casing;
support columns formed so as to protrude from the base part to a space outside the LED illumination apparatus; and
a fan device having a frame supported by the support columns, wherein
the fan device makes taken-in air collide with the end face of the base part that faces away from the concave part and exhausts the air through the window parts each formed by adjacent support columns as a pair of side frames thereof and the sides of the respective frame and base part that face each other as upper and lower frames thereof.
2. An LED illumination apparatus comprising:
a tubular lens casing that has a first end face at which illuminating lenses are provided and a second end face;
an LED holding part on which LED elements are mounted;
a base part provided on the second end face side of the lens casing and having, in the outer surface thereof, a plurality of air passages extending toward the lens casing;
a concave part formed in the base part so as to house the LED holding part;
a coupling part that holds a coupling state between the lens casing and the base part by fitting the lens casing to the concave part at the second end face to hermetically seal the internal space of the lens casing;
a fan device disposed opposite to the base part; and
a housing having openings at its both ends and housing therein the base end part and fan device, wherein
the base end part is disposed inside the housing with the air passages facing one of the openings, and the fan device is disposed so as to take in air through the air passages and discharge the taken-in air from the other one of the openings.

3. The LED illumination apparatus according to claim 1, wherein
the LED holding part is fixed to the bottom surface of the concave part with a screw.

4. The LED illumination apparatus according to claim 3, wherein
the leading end of the screw penetrates through the bottom surface of the concave part and protrudes to the outside space.

5. The LED illumination apparatus according to claim 1, wherein
the surface of the end of the base part that is opposed to the fan device is made irregular.

6. The LED illumination apparatus according to claim 1, wherein
the surface of the end of the base part that is opposed to the fan device is made to protrude toward the fan device, and the side surface of the protruding portion is formed into a step-like shape or a substantially tapered shape.

7. The LED illumination apparatus according to claim 1, wherein
a plurality of grooves are formed in the side surface of the base part.

8. The LED illumination apparatus according to claim 7, wherein
the grooves are formed so as to extend from the fan device toward the lens casing.

9. The LED illumination apparatus according to claim 1, wherein
heat radiation coating or heat absorption coating including black alumite treatment is applied on the outer surface of the base part and the inner surface of the concave part.

10. The LED illumination apparatus according to according to claim 9, wherein
the heat radiation coating is achieved by black alumite treatment using treatment liquid containing no environmental load substance.

11. The LED illumination apparatus according to claim 1, wherein
a cut part is formed in the side surface of the frame that substantially communicates with the support column.

* * * * *